(12) United States Patent
Ice

(10) Patent No.: US 7,484,987 B2
(45) Date of Patent: Feb. 3, 2009

(54) LATCH ASSEMBLY FOR AN OPTOELECTRONIC MODULE

(75) Inventor: Donald A. Ice, Milpitas, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/693,687

(22) Filed: Mar. 29, 2007

(65) Prior Publication Data
US 2008/0146066 A1 Jun. 19, 2008

Related U.S. Application Data

(60) Provisional application No. 60/870,806, filed on Dec. 19, 2006, provisional application No. 60/870,807, filed on Dec. 19, 2006.

(51) Int. Cl.
*H01R 13/627* (2006.01)
(52) U.S. Cl. ...................... 439/350; 439/372
(58) Field of Classification Search ......... 439/296–298, 439/350, 353, 357, 374, 372; 385/53
See application file for complete search history.

(56) References Cited

U.S. PATENT DOCUMENTS

| | | | |
|---|---|---|---|
| 4,911,519 A | 3/1990 | Burton et al. | |
| 6,302,596 B1 | 10/2001 | Cohen et al. | |
| 6,494,736 B2 * | 12/2002 | Mito | 439/385 |
| 6,652,158 B2 | 11/2003 | Bartur et al. | |
| 6,712,527 B1 | 3/2004 | Chan et al. | |
| 2002/0136501 A1 | 9/2002 | Yen et al. | |
| 2003/0020998 A1 | 1/2003 | Kuczynski | |
| 2003/0072540 A1 | 4/2003 | Huang | |
| 2003/0185525 A1 | 10/2003 | Lacy et al. | |
| 2004/0264887 A1 | 12/2004 | Rosenberg et al. | |
| 2006/0093281 A1 | 5/2006 | Kesler | |
| 2006/0281357 A1 * | 12/2006 | Chen et al. | 439/350 |

FOREIGN PATENT DOCUMENTS

| | | |
|---|---|---|
| JP | 16012672 | 1/2004 |
| JP | 17275407 | 10/2005 |

(Continued)

OTHER PUBLICATIONS

Ice, Donald A., Electromagnetic Interference Shield for an Optoelectronic Module, U.S. Appl. No. 11/693,679, filed Mar. 29, 2007.

(Continued)

*Primary Examiner*—Tho D Ta
(74) *Attorney, Agent, or Firm*—Workman Nydegger

(57) ABSTRACT

A module that includes a housing and a latch assembly at least partially positioned within the housing. The latch assembly has first and second associated states, and includes an actuation sleeve having a first position that corresponds with the first state, and a second position that corresponds with the second state. The latch assembly further includes first and second latch arms operably disposed with respect to the actuation sleeve so that respective first and second cam arrangements are defined where the latch arms are responsive to motion of the actuation sleeve. The latch arms partially extend from the housing when the actuation sleeve is in the first position, and the latch arms are substantially retracted within the housing when the actuation sleeve is in the second position.

20 Claims, 10 Drawing Sheets

FOREIGN PATENT DOCUMENTS

| | | |
|---|---|---|
| JP | 18106751 | 4/2006 |
| JP | 18106752 | 4/2006 |
| JP | 18108684 | 4/2006 |
| JP | 18259731 | 9/2006 |

OTHER PUBLICATIONS

Ice, Donald A., Optical Subassembly Connector Block for an Optoelectronic Module, U.S. Appl. No. 11/693,674, filed Mar. 29, 2007.

Ice, Donald A., Optical Connector Latch Assembly for an Optoelectronic Module, U.S. Appl. No. 11/693,681, filed Mar. 29, 2007.

Ice, Donald A., Connectorized Optical Subassembly Block for Use with a Communications Module, U.S. Appl. No. 60/870,806, filed Dec. 19, 2006.

Ice, Donald A., EMI Shield for Placement between an Optical Subassembly and a Connector Block in a Communications Module, U.S. Appl. No. 60/870,807, filed Dec. 19, 2006.

U.S. Appl. No. 11/960,530, Apr. 3, 2008, Office Action.

U.S. Appl. No. 11/960,530, filed Dec. 19, 2008, Donald A. Ice.

U.S. Appl. No. 11/960,550, filed Dec. 19, 2008, Donald A. Ice.

U.S. Appl. No. 11/693,674, Feb. 21, 2008, Office Action.

U.S. Appl. No. 11/693,681, Mar. 4, 2008, Office Action.

\* cited by examiner

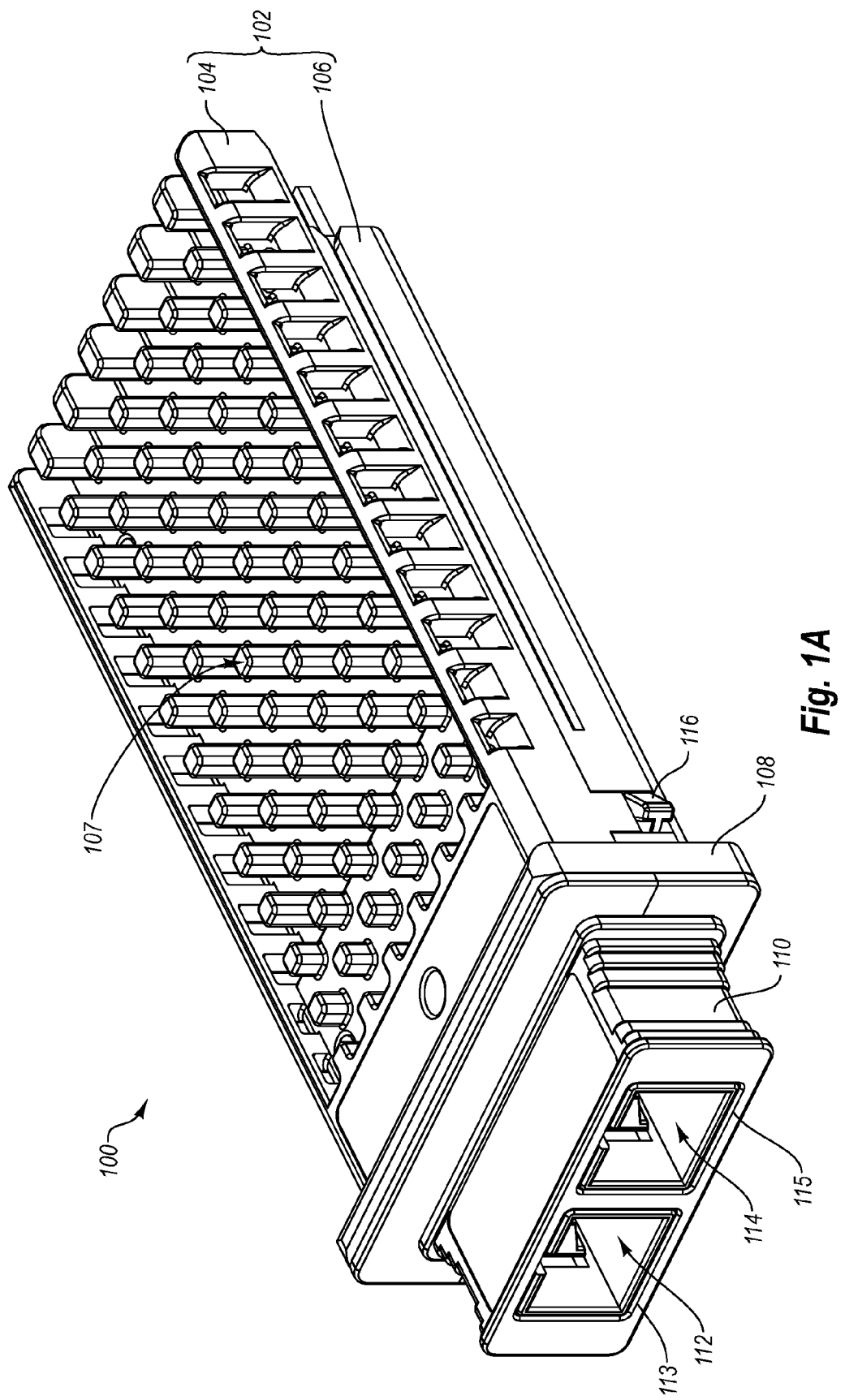

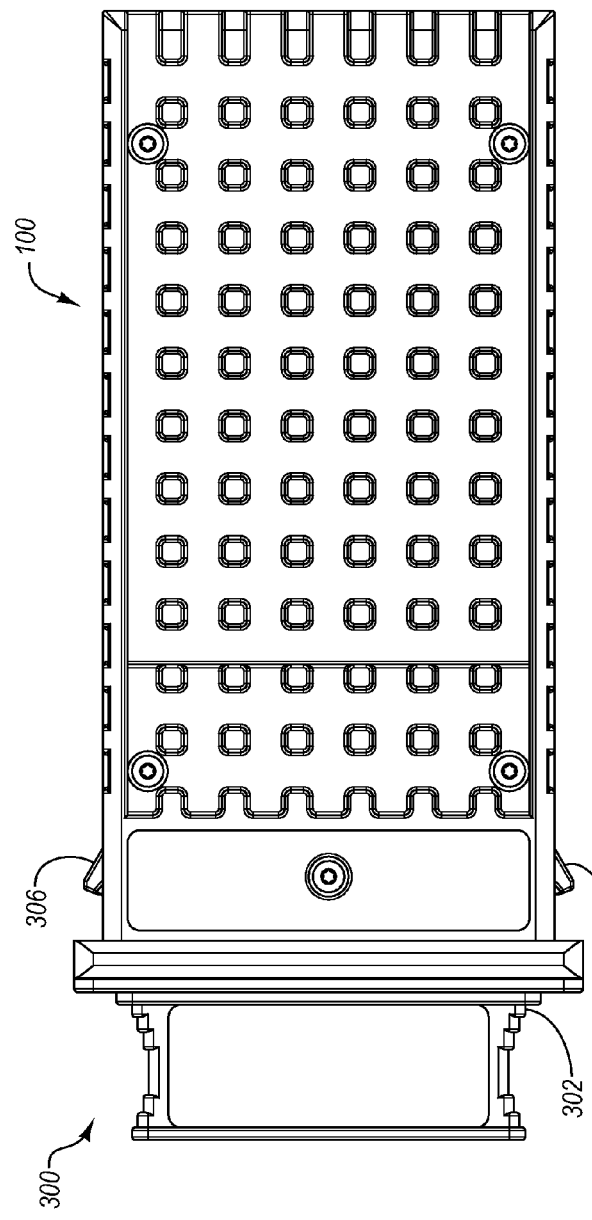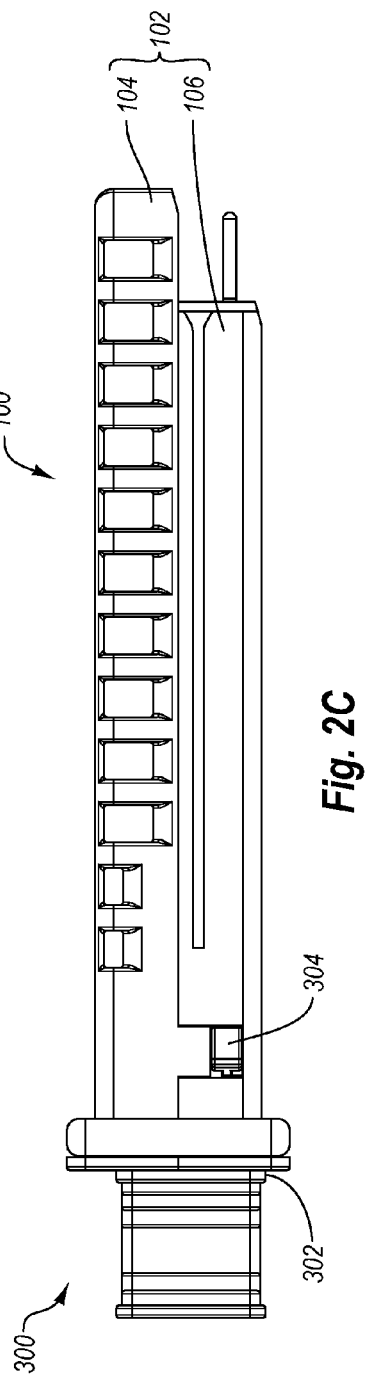
*Fig. 2B*
*Fig. 2C*

LATCH ASSEMBLY FOR AN OPTOELECTRONIC MODULE

CROSS-REFERENCE TO RELATED APPLICATIONS

This application claims priority to U.S. Provisional Patent Application Ser. No. 60/870,806, filed on Dec. 19, 2006 and U.S. Provisional Patent Application Ser. No. 60/870,807, filed on Dec. 19, 2006, each of which is incorporated herein by reference in its entirety.

BACKGROUND

Optoelectronic modules, such as optoelectronic transceiver or transponder modules, are increasingly used in optoelectronic communication. An optoelectronic module, such as an optoelectronic transponder module, includes various components that are necessary to enable optical data transmission and reception. The components are housed within a housing of the optoelectronic module. Examples of such internal components include a printed circuit board, a transmitter optical subassembly ("TOSA") and a receiver optical subassembly ("ROSA"). The optoelectronic module itself is configured to be received within a host device that serves as one component of a communications network.

In order to communicate with an associated host device, an optoelectronic module must be positioned within a structure, such as a cage for example, of the host device. When the optoelectronic module is thus positioned, a connector of the optoelectronic module is able to physically and electrically interface with a corresponding host device connector such that the optoelectronic module and the host device can then communicate with each other. The ability of the optoelectronic module and host device to communicate is contingent, at least in part, upon reliable retention of the optoelectronic module in the cage of the host device.

To that end, various mechanisms have been devised for connecting and disconnecting an optoelectronic module to/from a host device. However, typical mechanisms, sometimes referred to as latch or latching mechanisms, suffer from problems such as high part counts, tolerance stacking, and complexity. Moreover, the complexity of the designs of these mechanisms complicates the associated assembly processes. Among other things, these problems increase the costs associated with the production and assembly of these mechanisms, and also tend to degrade the reliability and operability of these mechanisms.

SUMMARY OF AN EXAMPLE EMBODIMENT

In general, embodiments of the invention relate to communication modules and, in particular, to a module having a latch assembly that enables the module to be removably positioned in a structure, such as a cage, of a host device.

In one example embodiment, a module is provided that includes a housing and a latch assembly at least partially positioned within the housing. The latch assembly has first and second associated states, and includes an actuation sleeve having a first position that corresponds with the first state, and a second position that corresponds with the second state. The latch assembly further includes first and second latch arms operably disposed with respect to the actuation sleeve so that respective first and second cam arrangements are defined where the latch arms are responsive to motion of the actuation sleeve. The latch arms partially extend from the housing when the actuation sleeve is in the first position, and the latch arms are substantially retracted within the housing when the actuation sleeve is in the second position.

These and other aspects of example embodiments of the present invention will become more fully apparent from the following description and appended claims.

BRIEF DESCRIPTION OF THE DRAWINGS

To further clarify the above and other aspects of example embodiments of the present invention, a more particular description of these examples will be rendered by reference to specific embodiments thereof which are disclosed in the appended drawings. It is appreciated that these drawings depict only example embodiments of the invention and are therefore not to be considered limiting of its scope. It is also appreciated that the drawings are diagrammatic and schematic representations of example embodiments of the invention, and are not limiting of the present invention nor are they necessarily drawn to scale. Example embodiments of the invention will be disclosed and explained with additional specificity and detail through the use of the accompanying drawings in which:

FIG. 1A is a front perspective view of an example optoelectronic module;

FIG. 2B is a top view of the example optoelectronic module of FIG. 2A;

FIG. 2C is a side view of the example optoelectronic module of FIG. 2A;

DETAILED DESCRIPTION OF EXAMPLE EMBODIMENTS

As noted above, example embodiments of the invention relate to communication modules and, in particular, to a module having a latch assembly that enables the module to be removably positioned in a structure, such as a cage, of a host device.

1. Example Optoelectronic Module

Figure 1B:
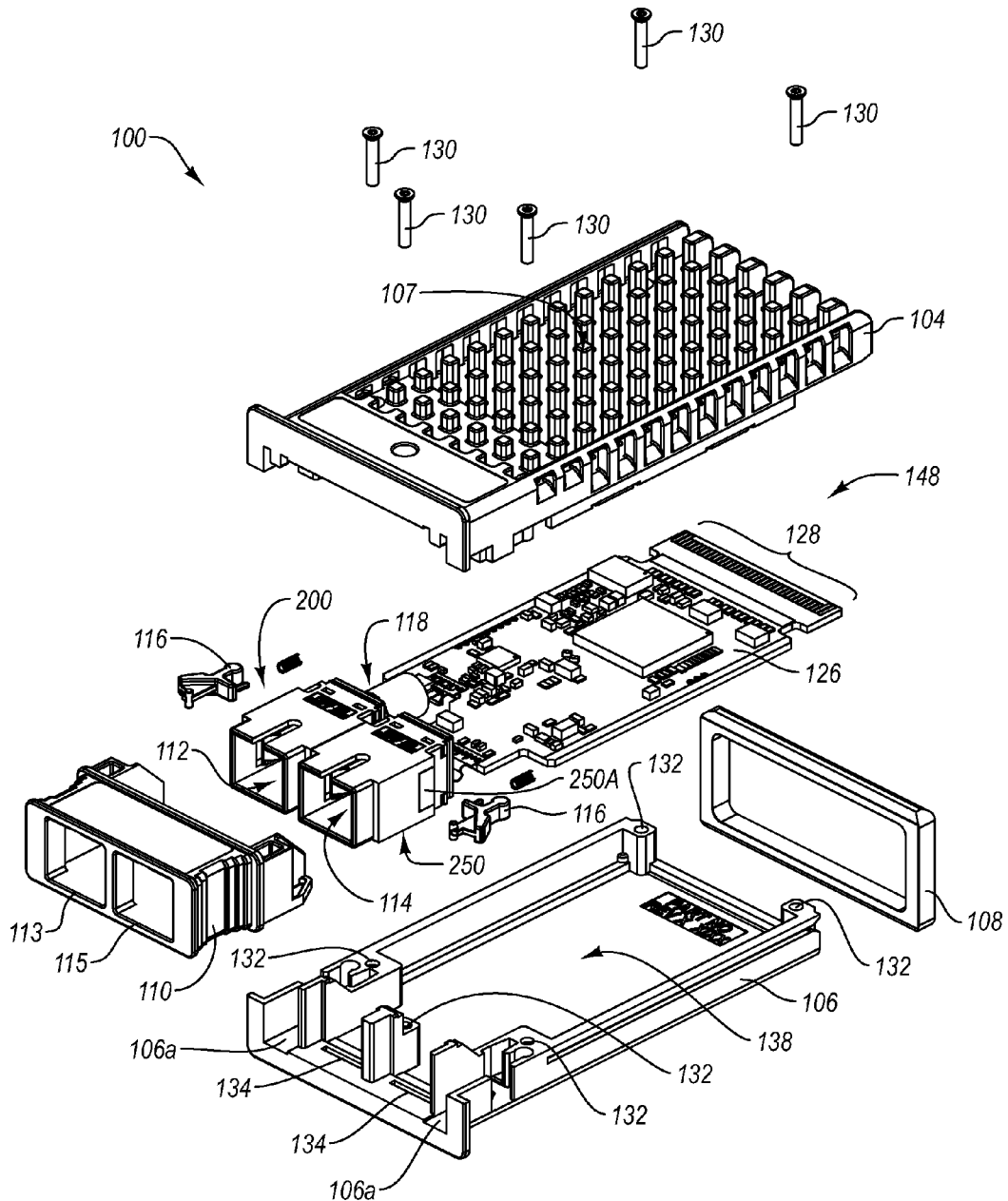
FIG. 1B is an exploded front perspective view of the example optoelectronic module of FIG. 1A.
Figure 1C:
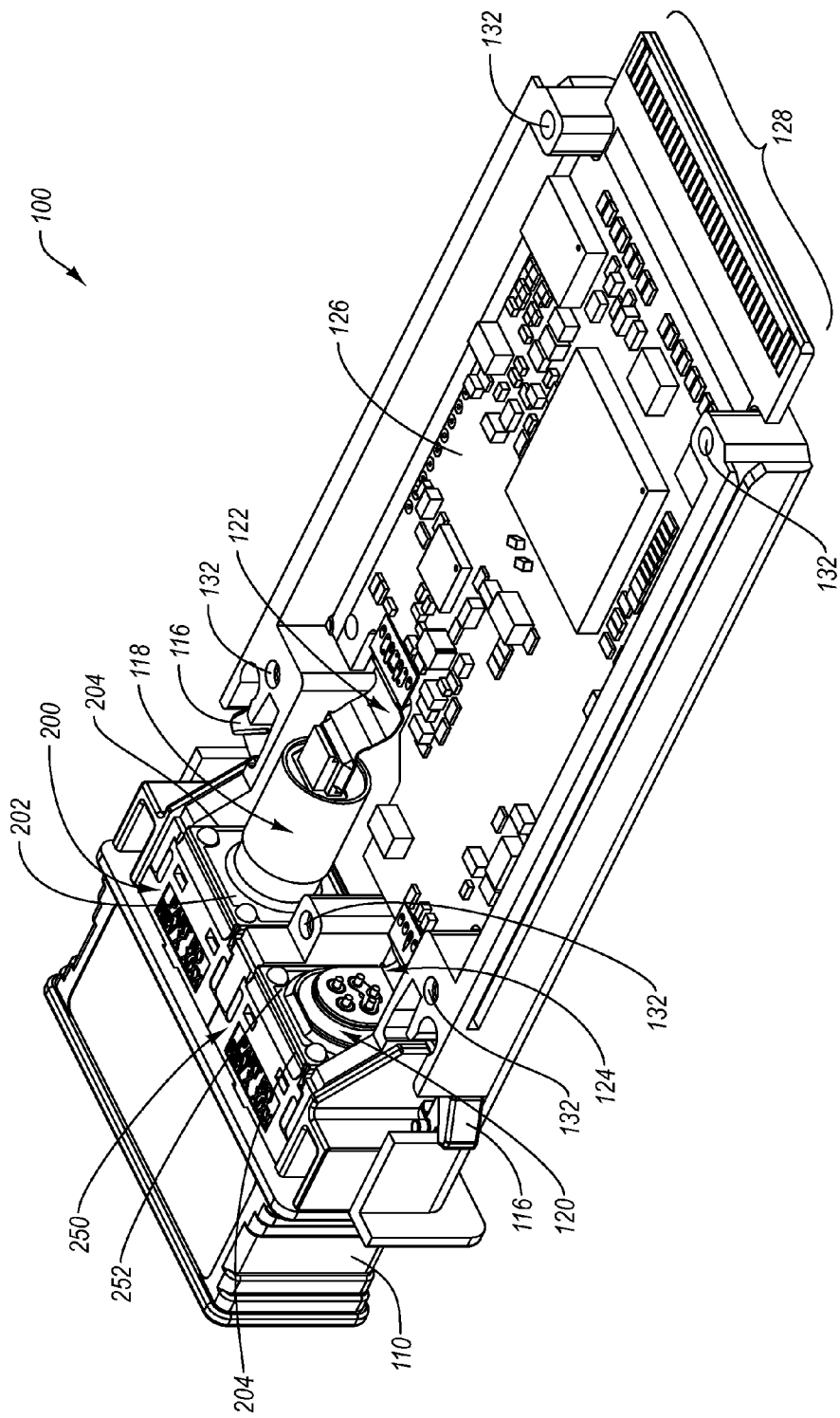
FIG. 1C is a rear perspective view of the example optoelectronic module of FIG. 1A with the cover removed.

Reference is first made to FIGS. 1A-1C, which disclose various aspects of an example optoelectronic module 100 for use in transmitting and receiving optical signals in connection with a host device (not shown). The optoelectronic module 100 can take a variety of forms and is not limited to the example embodiments disclosed herein. Following is a brief discussion of various example embodiments contemplated as being within the scope of the invention.

The optoelectronic module 100 can be configured for optical signal transmission and reception at a variety of per-second data rates including, but not limited to, 1 Gbit, 2 Gbit, 2.5 Gbit, 4 Gbit, 8 Gbit, 10 Gbit, 10.3 Gbit, 10.5 Gbit, or higher. Further, the optoelectronic module 100 can be configured for optical signal transmission and reception at various wavelengths including, but not limited to, 850 nm, 1310 nm, 1470 nm, 1490 nm, 1510 nm, 1530 nm, 1550 nm, 1570 nm, 1590 nm, or 1610 nm.

Also, the optoelectronic module 100 can be configured to support various communication protocols including, but not limited to, Fast Ethernet, Gigabit Ethernet, 10 Gigabit Ethernet, and 1×, 2×, 4×, and 10× Fibre Channel. Further, the optoelectronic module 100 can be configured to operate at various temperature ranges including, but not limited to, 0° C. to 70° C. In addition, although one example of the optoelectronic module 100 is an optoelectronic transponder module configured to have a form factor that is substantially compliant with the X2 Multi-Source Agreement ("X2 MSA"), and is thus referred to as an X2 transponder module, the optoelectronic module 100 can alternatively be configured to have a variety of different form factors that are substantially compliant with other transceiver and/or transponder MSAs now known and/or developed in the future.

With particular attention now to FIGS. 1A-1C, the example optoelectronic module 100 includes various components, including a housing 102 that includes a cover 104 and a shell 106. The cover 104 includes a heat sink 107. The heat sink 107 functions to dissipate heat generated within the optoelectronic module 100. The cover 104 and the shell 106 can be formed using a die casting process. One example material from which the cover 104 and the shell 106 can be die cast is a zinc alloy, although the cover 104 and the shell 106 may alternatively be die cast, or otherwise constructed, from other suitable materials.

As disclosed in FIGS. 1A-1C, the example optoelectronic module 100 also includes an EMI gasket 108 that encircles the cover 104 and the shell 106, a actuation sleeve 110 connected to the cover 104 and the shell 106, a transmit receptacle 112 and a receive receptacle 114. A latch assembly is provided that includes an actuation sleeve 110 defining openings 113 and 115 by way of which the transmit receptacle 112 and the receive receptacle 114, respectively, can be accessed. The latch assembly further includes a pair of latch arms 116 that are operably disposed with respect to the actuation sleeve 110. In general, the actuation sleeve 110 moves along tracks 106a defined by the shell 106 and can be employed to engage/ disengage the latch arms 116 with/from a host device (not shown). Additional details regarding the structure and function of example embodiments of a latch assembly that includes an actuation sleeve and a corresponding pair of latch arms is set forth below.

Note that the actuation sleeve 10 may also be referred to as a de-latch sleeve in some related applications. Nonetheless, neither term is intended to have any limiting effect with respect to any present or future claims in this case or the aforementioned related cases.

With continued reference to FIGS. 1A-1C, each of the receptacles 112 and 114 are configured to receive an optical fiber connector (not shown). The receptacles 112 and 114 can each be configured to receive an optical fiber connector having one of various configurations including, but not limited to, an SC optical fiber connector.

As further disclosed in FIGS. 1A-1C, the example optoelectronic module 100 further includes a transmitter OSA ("TOSA") 118, a receiver OSA ("ROSA") 120, and two substantially identical OSA connector blocks 200 and 250 within which the TOSA 118 and the ROSA 120, respectively, are partially positioned. The TOSA 118 and the ROSA 120 are held in place within the OSA connector blocks 200 and 250 by adhesives 202 and 252, respectively.

The OSA connector blocks 200 and 250 may further define a pair of openings (not shown). The openings are each configured to receive at least a portion of an optical connector latch arm (see, e.g., 250A of FIG. 1B). After assembly, at least a portion of each of the optical connector latch arms may extend into the transmit receptacle of the associated OSA connector block so that the optical connector latch arms are positioned to releasably engage an optical fiber connector (not shown) that is plugged into the transmit receptacle, and/ or receive receptacle.

Additional information regarding example embodiments of OSA blocks can be found in co-pending U.S. patent application Ser. No. 11/693,674, titled "OPTICAL SUBASSEMBLY CONNECTOR BLOCK FOR AN OPTOELECTRONIC MODULE," which is filed concurrently herewith and incorporated herein by reference in its entirety. As well, additional information regarding example embodiments of optical connector latch arms can be found in co-pending U.S. patent application Ser. No. 11/693,681, titled "OPTICAL CONNECTOR LATCH MECHANISM FOR AN OPTOELECTRONIC MODULE," which is filed concurrently herewith and incorporated herein by reference in its entirety.

In the example embodiment of FIGS. 1A-1C, an EMI shield 204 is attached to each of the OSA connector blocks 200 and 250. In general, the EMI shields 204 facilitate containment of electromagnetic radiation from the optoelectronic module 100 so that EMI associated with the optoelectronic module 100 can be controlled. Additional details regarding the structure and function of example embodiments of the EMI shields 204 can be found in co-pending U.S. patent application Ser. No. 11/693,679, titled "EMI SHIELD FOR AN OPTOELECTRONIC MODULE," which is filed concurrently herewith and incorporated herein by reference in its entirety.

With continued reference to FIGS. 1A-1C, the example optoelectronic module 100 also includes electrical interfaces 122 and 124 and a printed circuit board ("PCB") 126 having an edge connector 128. The two electrical interfaces 122 and 124 are used to electrically connect the TOSA 118 and the ROSA 120, respectively, to the PCB 126. The edge connector 128 can be used to electrically connect the PCB 126 with a host device (not shown).

As disclosed in FIG. 1B, the cover 104 and the shell 106 of the housing 102 can be connected to each other using fasteners 130. The fasteners 130 are configured to pass through the cover 104 and engage holes 132 in the shell 106. As disclosed in FIG. 1B, the shell 106 also includes structures 134 that are each configured to engage complementary structures (not shown) formed on one of the OSA connector blocks 200 or 250. The shell 106 further includes a shell cavity 138 which is sized and configured to receive the printed circuit board 126.

2. Aspects of an Example Latch Assembly

Directing attention now to FIGS. 2A-2C and FIGS. 3A-3C, further details are provided concerning the structure and operation of an example of a latch assembly 300. In the disclosed embodiment, the latch assembly 300 includes an actuation sleeve 302 operably engaged with a pair of latch arms 304 and 306 (see FIG. 3B). In general, the actuation sleeve 302 is engaged with the housing 102 such that the actuation sleeve 302 is capable of sliding back and forth between the actuation sleeve 302 positions indicated, respectively, in FIGS. 2A and 3A. This motion is associated with corresponding movements of the latch arms 304 and 306.

Figure 2A:
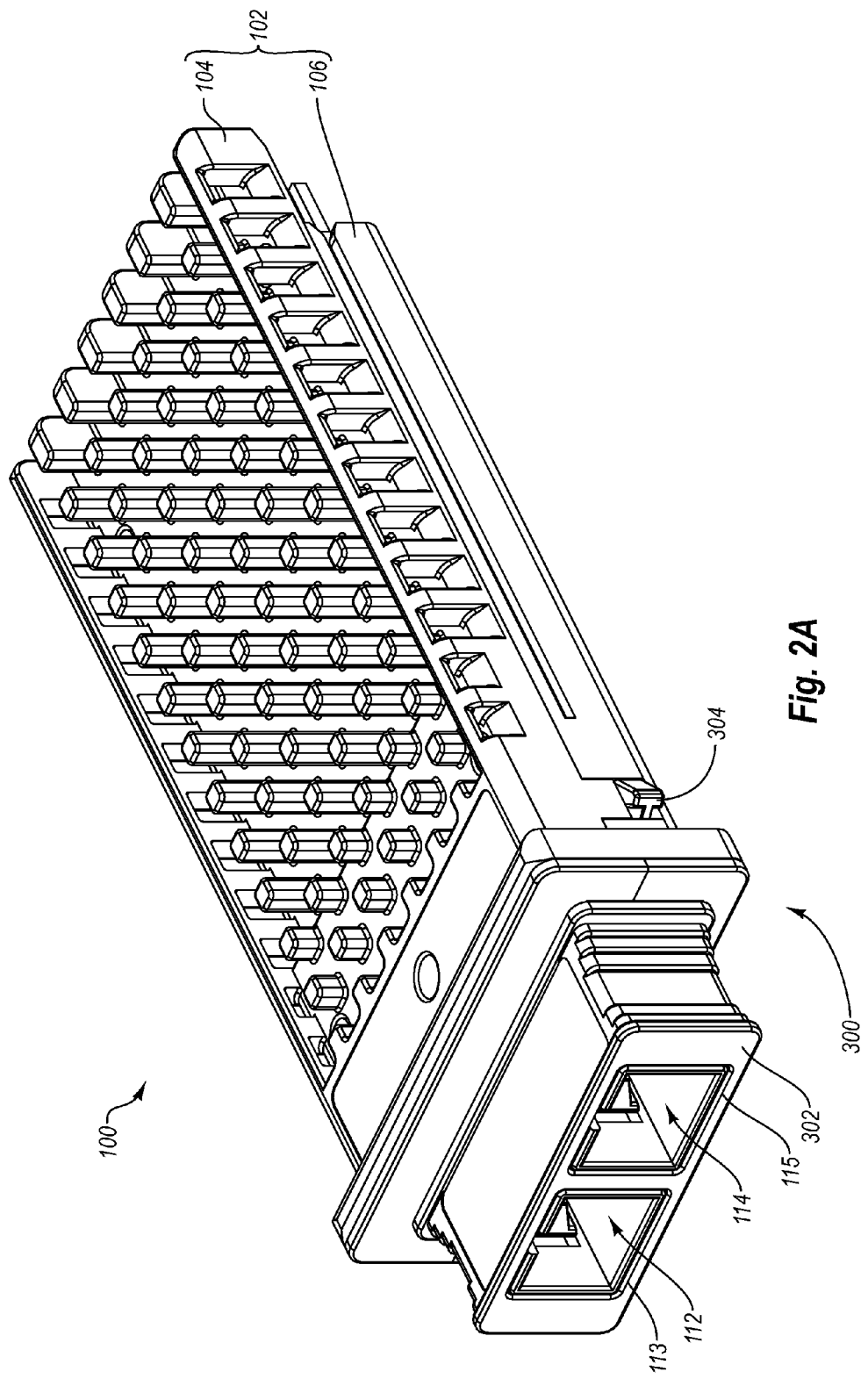
FIG. 2A is a front perspective view of an example optoelectronic module, disclosing a latch assembly in a latched disposition.

With attention first to FIGS. 2A-2C, the latch assembly 300 is disclosed with the latch arms 304 and 306 partially extending from the housing 102. Thus positioned, the latch arms 304 and 306 are able to engage corresponding structure of a host device, such as a cage (not shown). When the latch arms 304 and 306 are thus engaged, the optoelectronic module 100 is securely retained in the host device.

As further indicated in FIGS. 2A-2C, the retracted position of the actuation sleeve 302 corresponds with the extension of the latch arms 304 and 306 from the housing 102. That is, as discussed in further detail below, when the actuation sleeve 302 is positioned as shown, the springs 408 are free to bias the latch arms 404 and 406 into the extended position. Upon insertion of the optoelectronic module 100 into a card cage, the latch arms 404 and 406 are briefly pushed back into the housing 102 by the cage structure as the optoelectronic module 100 moves forward into the cage. At such time as the optoelectronic module is positioned where no portion of the cage structure constrains the rotation of the latch arms 404 and 406, the latch arms 404 and 406 return to their pre-insertion positions, that is, the latch arms 404 and 406 again extend out from the housing 102. Because the optoelectronic module 100 is now positioned in the cage, the latch arms 404 and 406 extend from the housing 102 into corresponding openings defined by the cage. The optoelectronic module 100 is thus securely retained in the cage by the cooperation of the cage with the latch arms 104 and 106.

By virtue of this orientation of the latch arms 304 and 306, the optoelectronic module 100 is thus securely retained in the host, or other, device until the actuation sleeve 302 is extended, as discussed below. The position of the actuation sleeve 302 that corresponds with extension of the latch arms 304 and 306 from the housing 102 may be referred to herein as a retracted position of the actuation sleeve 302.

Figure 3A:
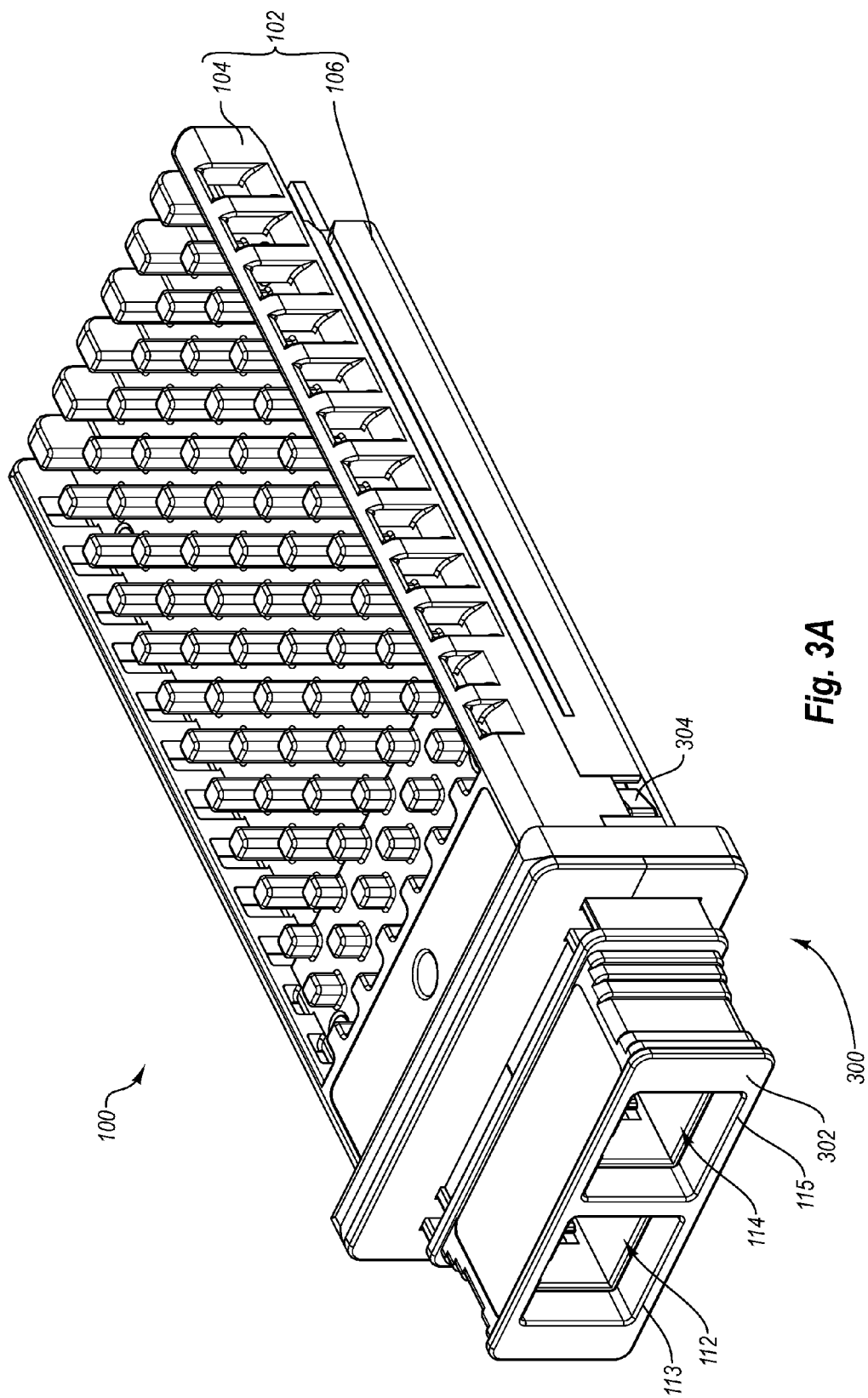
FIG. 3A is a front perspective view of an example optoelectronic module, disclosing a latch assembly in an unlatched disposition.
Figure 3B:
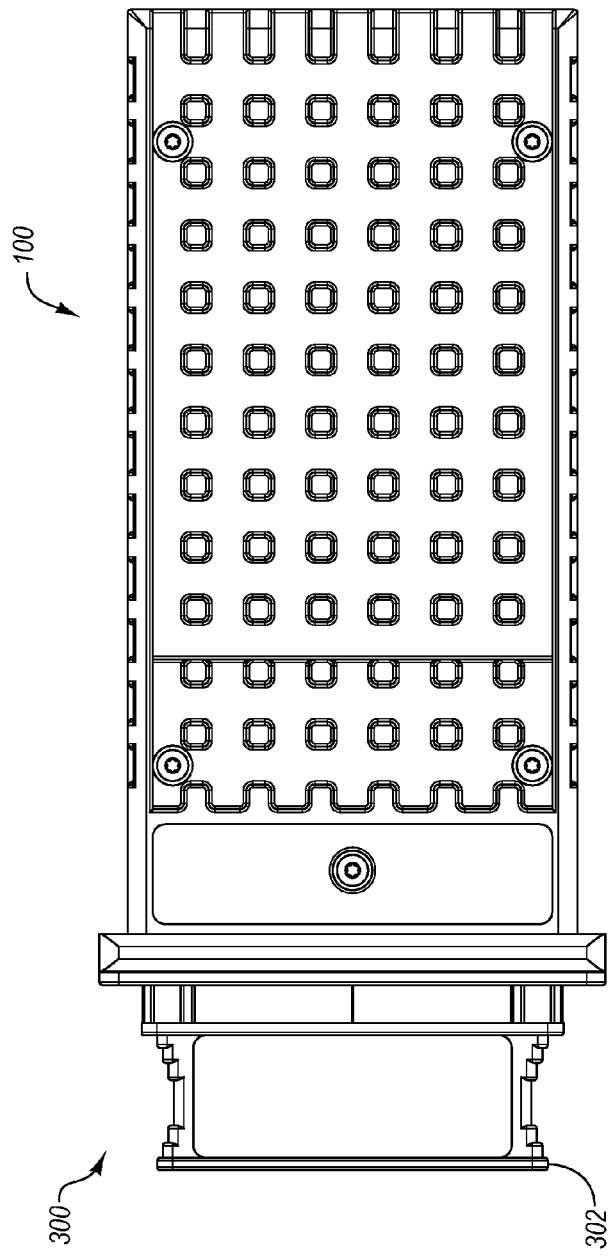
FIG. 3B is a top view of the example optoelectronic module of FIG. 3A.
Figure 3C:
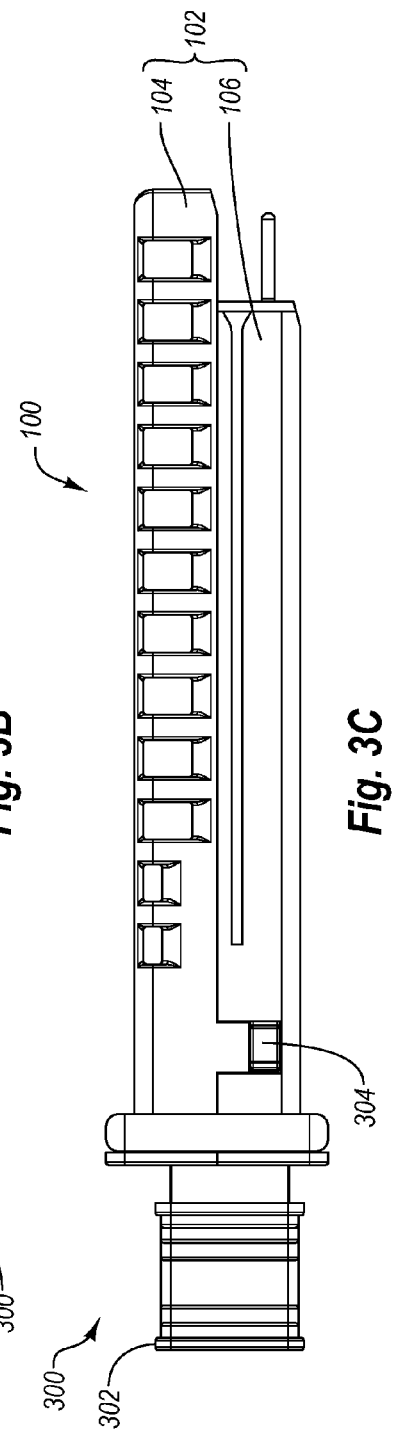
FIG. 3C is a side view of the example optoelectronic module of FIG. 3A.

Turning now to FIGS. 3A-3C, the latch assembly 300 is disclosed with the latch arms 304 and 306 retracted within the housing 102. When the latch arms 304 and 306 are thus positioned, the optoelectronic module 100 can be readily retracted from the corresponding structure of a host device, such as a cage.

As further indicated in FIGS. 3A-3C, the extended position of the actuation sleeve 302 corresponds with the retraction of the latch arms 304 and 306 from the housing 102. That is, as discussed in further detail below, when the movable actuation sleeve 302 is moved in a direction away from the housing 102, such as would occur when a user is removing the optoelectronic module 100 from a host device for example, the latch arms 304 and 306 are moved to the retracted position indicated in FIGS. 3A-3C. Thus, the natural tendency of a user to pull the optoelectronic module 100 when it is desired to remove the optoelectronic module 100 from a host device, is coupled with the movement of the latch arms 304 and 306 to a position where they pose no impediment to removal of the optoelectronic module 100 from the host device.

By virtue of this orientation of the latch arms 304 and 306, the optoelectronic module 100 can be readily removed the host, or other, device. The position of the actuation sleeve 302 that corresponds with retraction of the latch arms 304 and 306 from the housing 102 may be referred to herein as an extended position of the actuation sleeve 302.

Figure 4A:
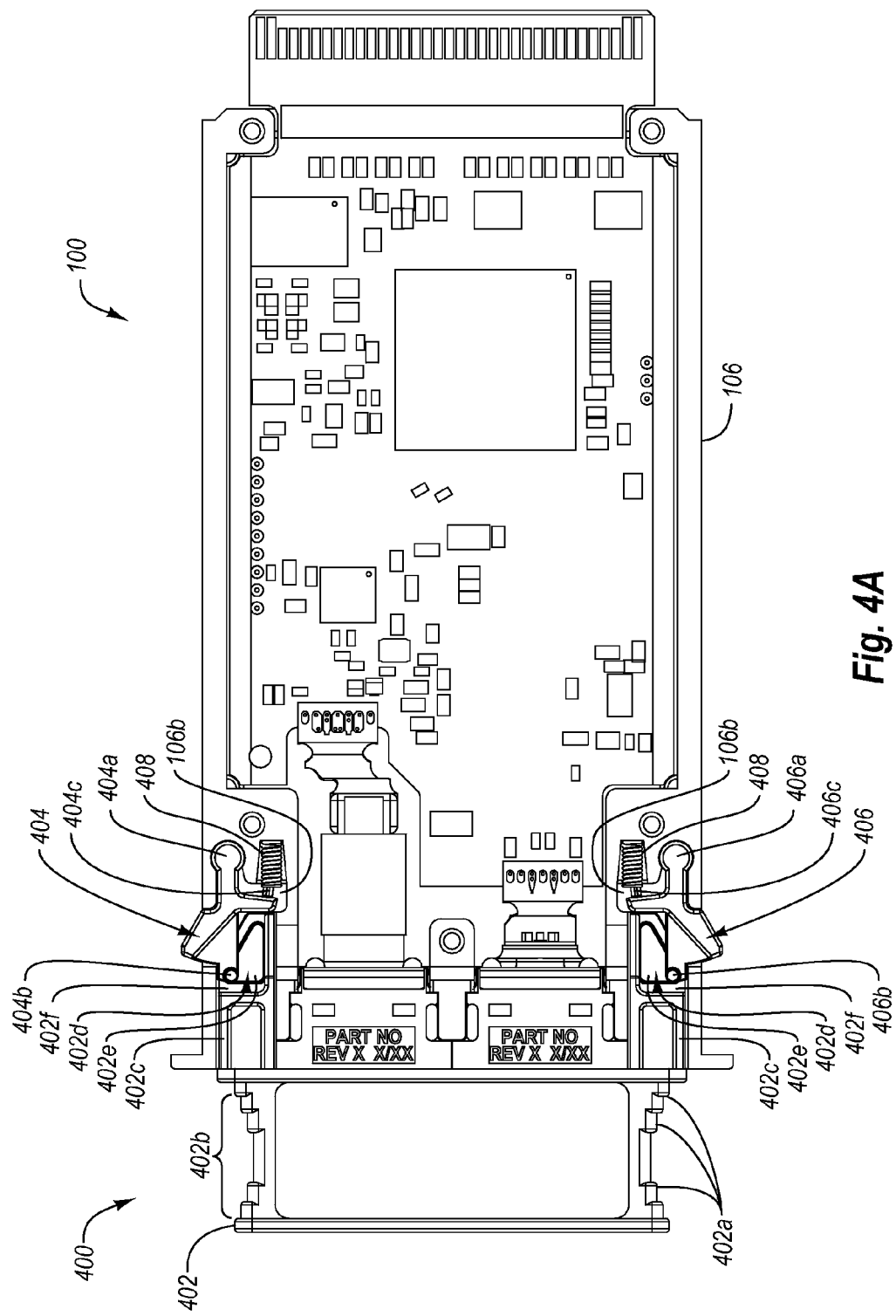
FIGS. 4A, 4B, and 5 are views of an optoelectronic module, disclosing aspects of the interaction between the module housing and the latch assembly.
Figure 4B:
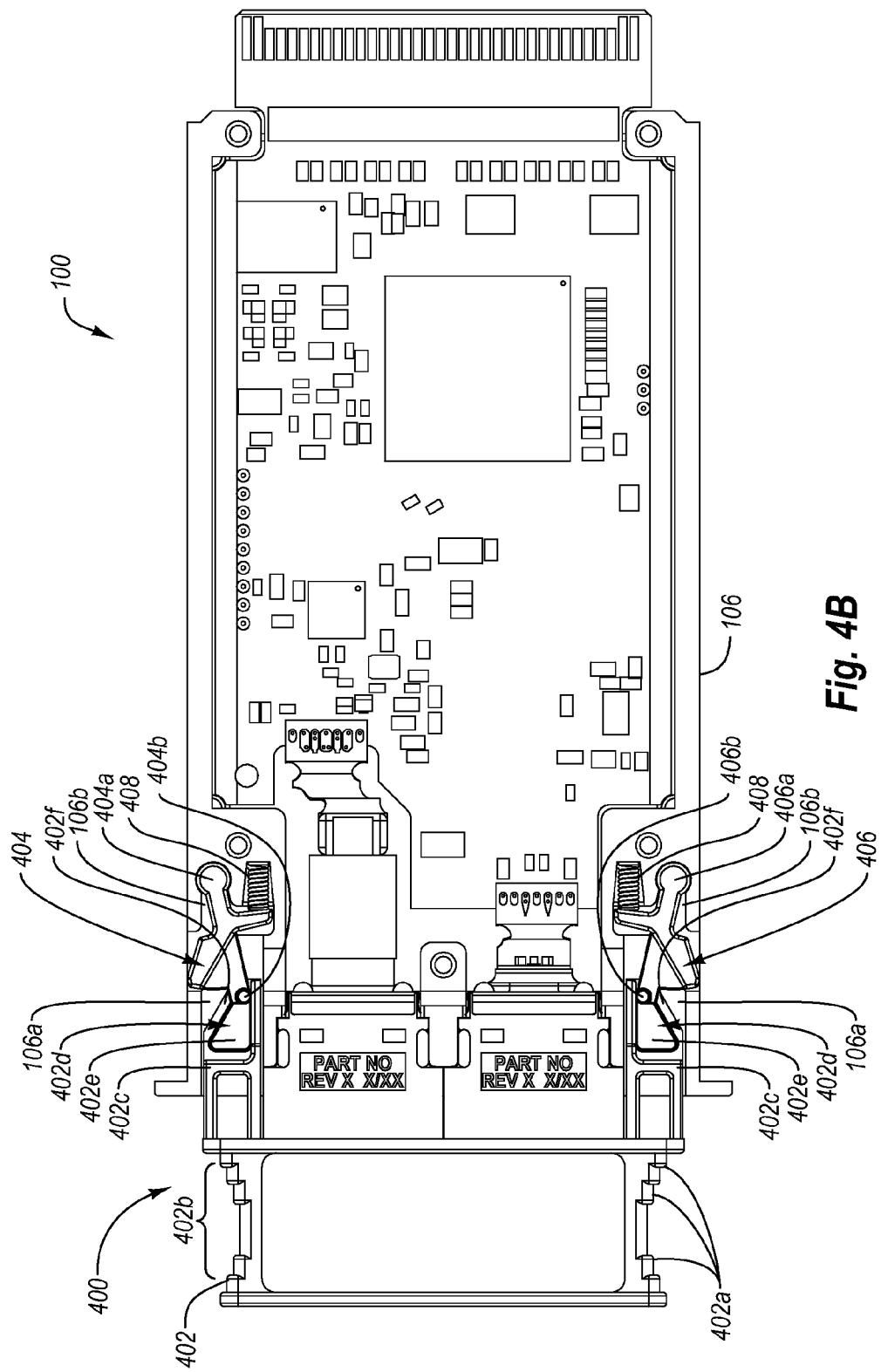

Turning now to FIGS. 4A and 4B, more particular information is provided concerning aspects of the structure and operation of a latch assembly. As indicated in FIGS. 4A and 4B, the example latch assembly 400 includes an actuation sleeve 402 that is operably engaged with latch arms 404 and 406. With respect, first, to the actuation sleeve 402, grip features 402a may be provided that enhance the usability of the actuation sleeve 402. Additionally, the actuation sleeve 402 may define opposing indented portions 402b that enable a user to more readily grip the actuation sleeve 402. In at least some embodiments, the actuation sleeve 402 comprises plastic, but any other suitable material(s) may alternatively be employed.

With continue reference to the actuation sleeve 402, a pair of sliding elements 402c are provided that are slidingly received in respective tracks 106a defined by the shell 106. As a result of this configuration and arrangement, the actuation sleeve 402 can, as collectively indicated by FIGS. 4A and 4B, slide back and forth with respect to the shell 106 of the housing 102. As discussed below, the range of motion of the actuation sleeve 402 is constrained in part by the latch arms 404 and 406. The actuation sleeve 402 further includes a pair of guides 402d. In the illustrated example, the guides 402d each include a guide surface 402e that is at least partially bounded a corresponding guide ridge 402f.

As further indicated in FIGS. 4A and 4B, the latch arms 404 and 406 are each configured to rotate with respect to the shell 106. More particularly, each include a pivot portion 404a and 406a, respectively, that resides, and is retained, in latch arm cavities 106b by the shell 106. Each of the latch arms 404 and 406 also includes a follower 404b and 406b that is engaged with a corresponding guide 402d. As discussed in further detail below, motion of the actuation sleeve 402 results in a corresponding motion of the followers 404b and 406b with respect to the guides 402d of the actuation sleeve 402. In general however, the guide ridges 402f serve to constrain, and guide, the motion of the followers 404b and 406b and, thus, the motion and positioning of the latch arms 404 and 406.

The example latch assembly of FIGS. 4A and 4B further includes a pair of springs 408, each of which are confined in a corresponding latch arm cavity 106b defined by the shell 106. Each of the springs 408 engages a corresponding post 404c and 406c of the latch arms 404 and 406, respectively, so that the position of the springs 408 relative to the latch arms 404 and 406 is maintained. In general, the springs 408 are positioned and configured to bias the latch arms 404 and 406 toward the extended position indicated in FIG. 4A.

Thus, when the optoelectronic module 100 is positioned in a host, or other, device, the springs 408 serve to ensure that the latch arms 404 remain extended and, thus, engaged with the structure of the host device. In this way, the springs 408 help to retain the optoelectronic module 100 in the host device until such time as a user removes the optoelectronic module 100. As suggested by FIGS. 4A and 4B, and discussed below, the actuation sleeve 402 can be used to overcome the bias imposed by the springs 408 such that the optoelectronic module 100 can be removed from the host device.

3. Example Process for Assembling an Example OSA Connector Assembly

Figure 5:
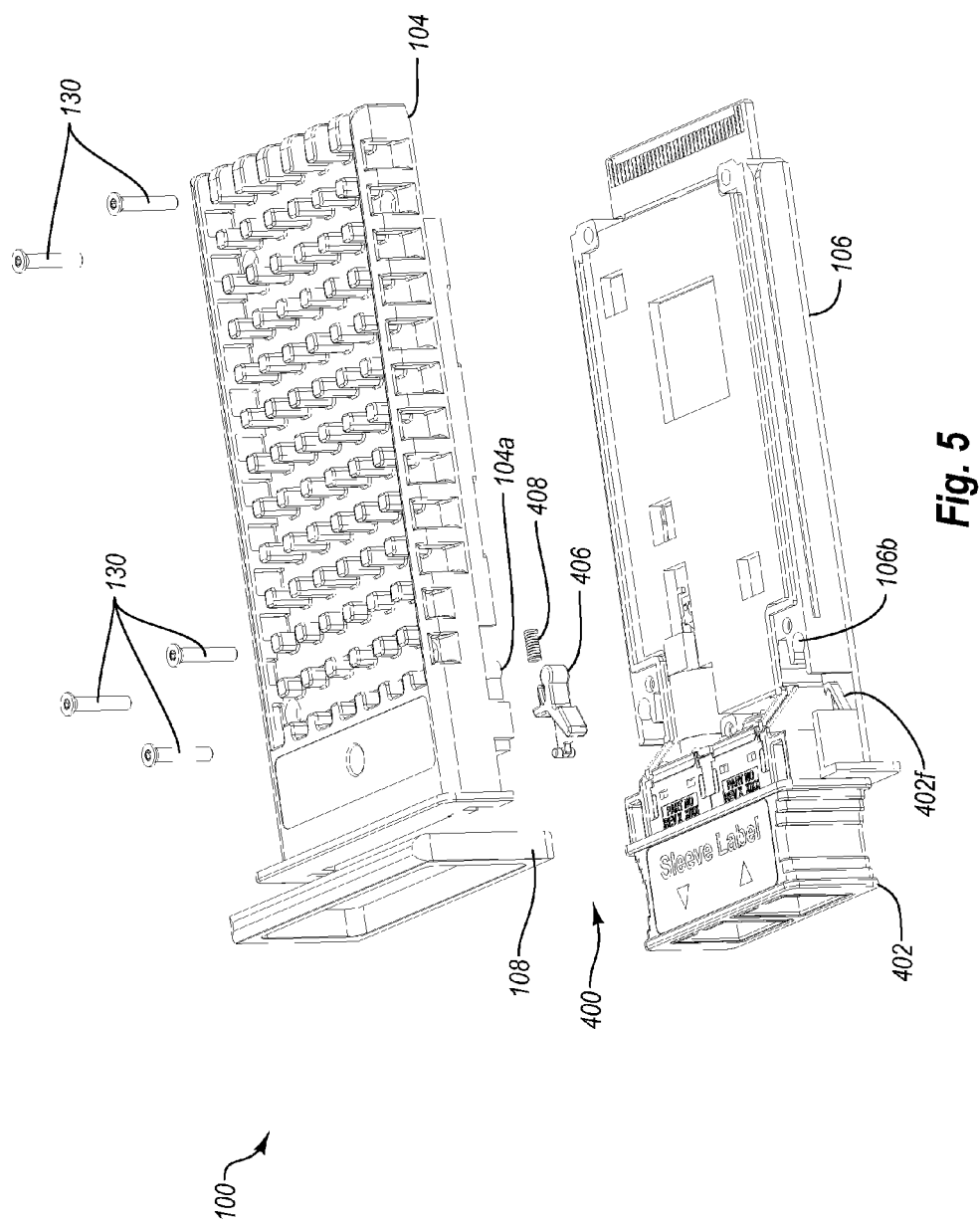

As suggested by the foregoing discussion, one useful aspect of the latch assembly 400 is that it is relatively simple and has a relatively low part count. Additionally, example embodiments of the latch assembly 400 are also relatively simple to install in the optoelectronic module. Turning now to FIG. 5, details are provided concerning aspects of a process by which the latch assembly 400 may be installed in the optoelectronic module 100. It should be noted that the following discussion makes specific references to latch arm 406, but applies with equal force to the installation of latch arm 404. It should further be noted that, as disclosed in the figures, the latch arms 404 and 406 have the same configuration, that is, the latch arms 404 and 406 are configured so that they are interchangeable with each other. In practice, either latch arm could be positioned in either latch arm cavity of the optoelectronic module. Among other things, this configuration of the latch arms simplifies manufacturing since different left and right arm configurations are not required.

In the first step of the installation of the latch assembly 400 into the optoelectronic module 100, the actuation sleeve 402 is positioned on the tracks 106a (see, e.g., FIG. 1B) defined by the shell 106 and moved into the position indicated in FIG. 5. Next, a spring 408 is positioned on post 406c of arm 406. The spring 408 is pre-compressed, and then the pre-compressed spring and latch arm 406 are dropped together in the latch arm cavity 106b (see also, FIG. 4A). The same process is performed for latch arm 404 and its corresponding spring 408. At this point, installation of the latch assembly 400 in the shell 106 is complete, and completion of the assembly of the optoelectronic module 100 requires only a few additional steps.

In particular, the cover 104, which includes a pair of retaining elements 104a whose configuration and location are complementary with respect to the latch arm cavities 106b, is positioned on the shell 106 so that the retaining elements 104a are received in the associated latch arm cavities 106b. As a result of this arrangement, the latch arm 406 is prevented from any significant movement in the y-direction. The cover 104 can then be secured to the shell 106 with fasteners 130. Finally, the EMI gasket 108 is positioned about the cover 104 and shell 106 (see also, FIG. 1A).

4. Operation of An Example Latch Assembly

Directing renewed attention to FIGS. 4A and 4B, details are provided concerning aspects of the operation of an embodiment of a latch assembly, denoted generally at 400.

With reference first to FIG. 4A, the actuation sleeve 402 of the latch arm assembly 400 is disposed in a retracted position consistent with insertion of the optoelectronic module into a cage or other structure of a device such as a host device. When the actuation sleeve 402 is thus positioned, the tips of the followers 404b and 406b of the latch arms 404 and 406, respectively, are positioned on, or near, the guide surfaces 402e of guides 402d as shown. Movement of the actuation sleeve 402 forward beyond the position disclosed in FIG. 4A is prevented, at least in part, by the fixed position of the pivot portions 404a and 406a. Moreover, additional forward progress of the guide ridges 402f of the actuation sleeve 402 is prevented by the followers 404b and 406b.

As noted earlier, insertion of the optoelectronic module 100 into a card cage causes the latch arms 404 and 406 to be momentarily pushed back into the housing 102 by the cage structure as the optoelectronic module 100 moves forward into the cage. Once the optoelectronic module 100 is fully received in the cage or other structure, the latch arms 404 and 406 return to their pre-insertion positions, that is, the latch arms 404 and 406 again extend out from the housing 102 and now engage the cage structure.

Directing attention now to FIG. 4B, the actuation sleeve 402 is disposed in a retracted position preparatory to removal of the optoelectronic module 100 from a cage or other structure of a device such as a host device. When the actuation sleeve 402 is thus positioned, the tips of the followers 404b and 406b of the latch arms 404 and 406, respectively, are positioned on, or near, the guide surfaces 402e of guides 402d as shown. Extension of the actuation sleeve 402 beyond the position disclosed in FIG. 4B is prevented, at least in part, by the followers 404b and 406b which extend downward to the guide surfaces 402e and thus prevent further motion of the guide ridges 402f, which extend upward a distance from the guide surfaces 402e.

As is further apparent from FIG. 4B, extension of the actuation sleeve 402 to the indicated position is sufficient to overcome the bias imposed by the springs 408. As noted elsewhere herein, the springs 408 bias the latch arms 404 and 406 into the extended position (see, e.g., FIG. 4A). Thus, by virtue of the action of the guide ridges 402f and guide surfaces 402e on the followers 404b and 406b, extension of the actuation sleeve 402 not only moves the latch arms 404 and 406 to the retracted position indicated in FIG. 4B, but also is effective to overcome the bias imposed by the springs 408. When the latch arms 404 and 406 are thus retracted, the optoelectronic module 100 can then be removed from the cage or other structure.

As the foregoing discussion makes clear, the interaction between the guides 402d and the followers 404b and 406b is in the nature of a cam. That is, a substantially linear motion of the actuation sleeve 402 to the extended position results in a corresponding rotational motion of the latch arms 404 and 406 about respective pivot portions 404a and 406a. As discussed below in connection with FIG. 4A, the cam effect is only employed in connection with the removal of the optoelectronic module 100 from the cage or other structure of a device, such as a host device.

In operation then, movement of the actuation sleeve 402 from the extended position (FIG. 4B) to the retracted position (FIG. 4A) enables the followers 404b and 406b, urged by the springs 408, to move to the outermost portions of the guide surfaces 402e. That is, the triangular shape of the guide surfaces 402e, along with the corresponding guide ridges 402f, defines a range of motion for the followers 404b and 406b such that the followers 404b and 406b are free to move to positions that are consistent with extension of the latch arms 404 and 406 from the housing 402, as indicated in FIG. 4A. Additionally, and as noted above, the followers 404b and 406b are urged to those positions by the biasing influence of the springs 408. Thus, the guides 402 and corresponding followers 404b and 406b perform no role in the insertion of the optoelectronic module into the cage except insofar as those components are configured and positioned so as to present no impediment to extension of the latch arms 404 and 406 from the housing 102.

Correspondingly, movement of the actuation sleeve 402 from the retracted position (FIG. 4A) to the extended position (FIG. 4B) causes a corresponding inward motion of the followers 404b and 406b such that latch arms 404 and 406 are retracted within the housing 102. More specifically, the triangular geometry of the guide 402e converts the linear motion of the actuation sleeve 402 into an inward rotational motion of the latch arms 404 and 406 as the followers 404b and 406b are pushed inward by the motion of the angled portions of the guide ridges 402f. Thus, extension of the actuation sleeve 402 is effective to overcome the bias imposed by the springs 408 on the latch arms 404 and 406, and to positively move the latch arms 404 and 406 to their retracted position.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. A module, comprising:
   a housing; and a latch assembly at least partially positioned within the housing and having first and second associated states, and the latch assembly comprising:
  an actuation sleeve having a first position that corresponds with the first state, and a second position that corresponds with the second state; and
  first and second latch arms operably disposed with respect to the actuation sleeve so that respective first and second cam arrangements are defined where the latch arms are configured to rotate responsive to linear motion of the actuation sleeve, the latch arms partially extending from the housing when the actuation sleeve is in the first position, and the latch arms being substantially retracted within the housing when the actuation sleeve is in the second position.

2. The module as recited in claim 1, wherein the actuation sleeve is configured and arranged for substantially linear motion with respect to the housing.

3. The module as recited in claim 1, wherein:
the actuation sleeve defines first and second guides; and
the first and second latch arms each define a follower engaged with a respective guide.

4. The module as recited in claim 1, wherein the module substantially complies with the X2 MSA.

5. The module as recited in claim 1, wherein the actuation sleeve defines a pair of openings, each of the openings being substantially aligned with a corresponding receptacle of the module.

6. The module as recited in claim 5, wherein when:
the actuation sleeve is in a retracted position, the latch arms are in an extended position; and
the actuation sleeve is in an extended position, the latch arms are in a retracted position.

7. The module as recited in claim 1, wherein the actuation sleeve and the latch arms each comprise a monolithic element.

8. An optoelectronic module, comprising:
a housing; and
a latch assembly at least partially positioned within the housing and having first and second associated states, and the latch assembly comprising:
  an actuation sleeve that defines first and second guides, and the actuation sleeve having a first position that corresponds with the first state, and a second position that corresponds with the second state; and
  first and second latch arms that are interchangeable with each other, each of which defines a follower operably disposed with regard to a respective guide defined by the actuation sleeve, the latch arms being configured to rotate with respect to the actuation sleeve such that when the actuation sleeve is in the first position, the latch arms at least partially extend from the housing, and when the actuation sleeve is in the second position, the latch arms are substantially retracted within the housing.

9. The optoelectronic module as recited in claim 8, further comprising:
first and second OSAs; and
a printed circuit board to which the first and second OSAs are connected, the first and second OSAs and printed circuit board being at least partially disposed within the housing.

10. The optoelectronic module as recited in claim 8, wherein the latch assembly further includes first and second springs, each of the springs serving to bias a corresponding latch arm toward an extended latch arm position, each of the springs further serving to allow the corresponding latch arm to rotate into a retracted latch arm position when the bias imposed by the springs is overcome.

11. The optoelectronic module as recited in claim 8, wherein the guides defined by the actuation sleeve each have a guide surface with a generally triangular shape, each of the guide surfaces being at least partially bounded by a respective guide ridge.

12. The optoelectronic module as recited in claim 8, wherein each of the latch arms is pivotably engaged with the housing.

13. The optoelectronic module as recited in claim 8, wherein the housing defines a pair of latch arm cavities within which respective latch arms are positioned.

14. The optoelectronic module as recited in claim 13, wherein a cover of the housing comprises a pair of retaining elements, a portion of each of the retaining elements being received in a respective latch arm cavity.

15. A module, comprising:
a housing; and
a latch assembly at least partially positioned within the housing, and the latch assembly comprising:
  an actuation sleeve slidingly engaged with the housing;
  first and second latch arms operably disposed with respect to the actuation sleeve such that extension of the actuation sleeve away from the housing corresponds with rotation of the latch arms to a position where the latch arms are substantially retracted within the housing; and
  first and second springs that bias the first and second latch arms, respectively, toward the position where the latch arms partially extend from the housing.

16. The module as recited in claim 15, wherein the module is substantially compliant with the X2 MSA.

17. The module as recited in claim 15, wherein:
the actuation sleeve defines first and second guides; and
the first and second latch arms each include a follower operably disposed with regard to a respective guide.

18. The module as recited in claim 15, wherein the actuation sleeve and the first and second latch arms collectively define a pair of cam arrangements.

19. The module as recited in claim 15, wherein the actuation sleeve and each of the latch arms comprise monolithic components.

20. The module as recited in claim 15, wherein a latch arm and a spring are disposed in each of a pair of latch arm cavities defined by the housing.

* * * * *